(12) United States Patent
Simons et al.

(10) Patent No.: US 10,347,472 B2
(45) Date of Patent: Jul. 9, 2019

(54) ZIRCONIUM OXIDE BASED SPUTTERING TARGET

(71) Applicant: MATERION ADVANCED MATERIALS GERMANY GMBH, Hanau (DE)

(72) Inventors: Christoph Simons, Biebergemünd (DE); Andreas Herzog, Bruchköbel (DE); Markus Schultheis, Flieden (DE); Anna Schott, Hösbach (DE)

(73) Assignee: MATERION ADVANCED MATERIALS GERMANY GMBH, Hanau (DE)

( * ) Notice: Subject to any disclaimer, the term of this patent is extended or adjusted under 35 U.S.C. 154(b) by 47 days.

(21) Appl. No.: 15/829,452

(22) Filed: Dec. 1, 2017

(65) Prior Publication Data

US 2018/0155820 A1 Jun. 7, 2018

Related U.S. Application Data

(63) Continuation of application No. PCT/EP2016/077709, filed on Nov. 15, 2016.

(30) Foreign Application Priority Data

Dec. 23, 2015 (EP) .................................. 15202311

(51) Int. Cl.
*H01J 37/34* (2006.01)
*C23C 14/34* (2006.01)
(Continued)

(52) U.S. Cl.
CPC .......... *H01J 37/3426* (2013.01); *C01G 25/02* (2013.01); *C23C 14/08* (2013.01);
(Continued)

(58) Field of Classification Search
CPC ... C23C 14/083; C23C 14/08; C23C 14/3414; H01J 37/3426; H01J 37/3429; C01G 25/02
See application file for complete search history.

(56) References Cited

U.S. PATENT DOCUMENTS 6,143,437 A * 11/2000 Kondou ................ C04B 35/486
427/255.32
6,395,381 B1 * 5/2002 Kondo .................. C04B 35/486
427/255.32
(Continued)

FOREIGN PATENT DOCUMENTS

CN 104451582 A 3/2015
EP 0 852 266 A1 7/1998

OTHER PUBLICATIONS

International Search Report and Written Opinion for International Application No. PCT/EP2016/077709 dated Dec. 15, 2016.
(Continued)

*Primary Examiner* — Michael A Band
(74) *Attorney, Agent, or Firm* — Fay Sharpe LLP

(57) ABSTRACT

The present invention relates to a sputtering target, which comprises a zirconium oxide as a sputtering material, wherein the zirconium oxide
has an oxygen deficiency, compared to the oxygen content of its fully oxidized form, of at least 0.40 wt %,
has a total amount of metal elements other than zirconium of less than 3.0 wt %, based on the total amounts of metal elements including zirconium, and
has an X-ray powder diffraction pattern having a peak P1 at 28.2°+/−0.2° 2-theta, a peak P2 at 31.4°+/−0.2° 2-theta, and a peak P3 at 30.2°+/−0.2° 2-theta.

13 Claims, 3 Drawing Sheets

US 10,347,472 B2

Page 2

(51) Int. Cl.
    *C23C 14/08*       (2006.01)
    *C01G 25/02*      (2006.01)

(52) U.S. Cl.
    CPC ........ *C23C 14/083* (2013.01); *C23C 14/3414* (2013.01); *C01P 2002/72* (2013.01)

(56) References Cited

U.S. PATENT DOCUMENTS

| | | | |
|---|---|---|---|
| 2003/0038028 A1 | 2/2003 | Schultheis et al. | |
| 2009/0269615 A1* | 10/2009 | Ramm | C22C 1/0416 |
| | | | 428/697 |
| 2012/0216710 A1* | 8/2012 | Yano | C01G 9/02 |
| | | | 106/286.2 |
| 2014/0087100 A1* | 3/2014 | Yaoita | C03C 17/36 |
| | | | 428/34 |
| 2014/0102879 A1* | 4/2014 | Nishioka | H01L 45/04 |
| | | | 204/192.21 |
| 2014/0262752 A1 | 9/2014 | Vergohl et al. | |

OTHER PUBLICATIONS

European Search Report of European Application No. 15202311.5 dated Jun. 15, 2016.
J. Oberste-Berghaus et al., Film Properties of Zirconium Oxide Top Layers from Rotatable Targets, 58$^{th}$ Annual Technical Conference Proceedings, Apr. 25-30, 2015, Santa Clara, CA, ISSN 0737-5921.

\* cited by examiner

ZIRCONIUM OXIDE BASED SPUTTERING TARGET

This application is a continuation of PCT Application PCT/EP2016/077709, filed Nov. 15, 2016, which claims priority to EP Application No. 15202311.5, filed Dec. 23, 2015.

The present invention relates to a sputtering target comprising a zirconium oxide based sputtering material, and a process for preparing such a sputtering target.

Three phases of zirconium dioxide $ZrO_2$ are known: The monoclinic phase (below 1170° C.), the tetragonal phase (from 1170° C. to 2370° C.), and the cubic phase (above 2370° C.). Monoclinic $ZrO_2$ has low electrical conductivity as well as low ionic conductivity.

It is known that ionic conductivity of $ZrO_2$ can be significantly increased by adding appropriate dopants such as yttrium oxide ($Y_2O_3$), magnesium oxide (MgO), calcium oxide (CaO) and cerium(III) oxide ($Ce_2O_3$). As the presence of these dopants is favouring the formation of the cubic or tetragonal phases, the doped zirconium oxide is also referred to as stabilized zirconium oxide.

Stabilized zirconium oxides are used in oxygen sensors and fuel cell membranes due to their ability to allow oxygen ions to move freely through the crystal structure at high temperatures. This high ionic conductivity (and low electrical conductivity) makes it one of the most useful electroceramics.

Zirconium oxides are materials of high refractive index and low absorption from the near-UV to the mid-IR range, and are therefore used for optical coatings.

A process generally known for providing a coating on a substrate is sputtering, wherein the sputter gas (e.g. argon) is ionized to form a plasma, and, in a gas atmosphere, the noble gas ions formed in this way are directed at a material source (the sputtering material of the sputtering target). Due to the ions of high energy, atoms of the sputtering material are ejected and become the coating material. The ejected particles of the sputtering material are forming the desired coating on the surface of the work piece to be coated.

Electrically conducting materials can be sputtered with a direct-current (DC) source, whereas for the sputtering of dielectric materials, it is necessary, for example, to ignite a high-frequency plasma in front of the target, so that the voltage does not drop over the insulating target. It is also known to provide dielectric coatings by reactive sputtering which is using an electrically conductive metal-based sputtering material and a reactive gas such as oxygen. However, compared to conventional sputtering processes, process efficiency is adversely affected and process control remains difficult.

As mentioned above, sputtering targets to be used for DC sputtering need to have a sufficiently high electrical conductivity. If this requirement is not met, they are inherently not suitable for DC sputtering. However, even if a sputtering material is electrically conductive, there are further properties to be complied with for achieving an acceptable sputtering performance. In particular, it would be desirable that arcing can be kept as low as possible during the sputtering process. Arcs are high power density short circuits which have the effect of miniature explosions. Arcing occurs particularly in targets with different conductive areas i.e. caused by different phases. Such different phases can appear during reactive sputtering of a metal target while the metal and a reactive gas generate non-conductive products on a target surface. Such local areas can be insulating and gather an electrical overcharge which causes an arc since overcharge is not discharged like in pure metal. When arcs occur on or near the surface of the insulating areas in the sputtering material, they can cause local melting. This material is ejected and can damage the material being processed and accumulates on other surfaces also on the substrates surface.

EP 0 852 266 A1 describes a sputtering target for providing transparent oxide coatings of high refractive index. The sputtering material of the sputtering target comprises a metal oxide of the chemical formula $MO_x$ as the main component, wherein $MO_x$ is a metal oxide which is deficient in oxygen compared to the stoichiometric composition, and M is at least one metal selected from the group consisting of Ti, Nb, Ta, Mo, W, Zr and Hf. The only zirconium oxide based sputtering material specified in EP 0 852 266 A1 is $ZrO_{1.995}$ which is doped with 8 mol % $Y_2O_3$. Its sputtering properties were not tested.

US 2003/0038028 A1 describes an electrically conducting sputter target comprising titanium dioxide ($TiO_2$) with an electrical resistivity of less than 5 Ohm-cm; and at least one doping agent or a mixture of doping agents added to the $TiO_2$ in an amount of less than 5 mole %, the doping agent or agents being selected from the group consisting of indium oxide ($In_2O_3$), zinc oxide (ZnO), bismuth oxide ($Bi_2O_3$), aluminum oxide ($Al_2O_3$), gallium oxide ($Ga_2O_3$), antimony oxide ($Sb_2O_3$), and zirconium oxide ($ZrO_2$). Sputtering targets based on an electrically conductive zirconium oxide are not described.

It is an object of the present invention to provide a zirconium oxide based sputtering target which can be used for DC sputtering processes and can be operated at low arcing.

The object is solved by a sputtering target, which comprises a zirconium oxide as a sputtering material, wherein the zirconium oxide
- has an oxygen deficiency, compared to the oxygen content of its fully oxidized form, of at least 0.40 wt %,
- has a total amount of metal elements other than zirconium of less than 3.0 wt %, based on the total amounts of metal elements including zirconium, and
- has an X-ray powder diffraction pattern, measured with Cu $K_{\alpha 1}$ radiation, having a peak P1 at 28.2°+/−0.2° 2-theta, a peak P2 at 31.4°+/−0.2° 2-theta, and a peak P3 at 30.2°+/−0.2° 2-theta.

DETAILED DESCRIPTION

Figure 1:
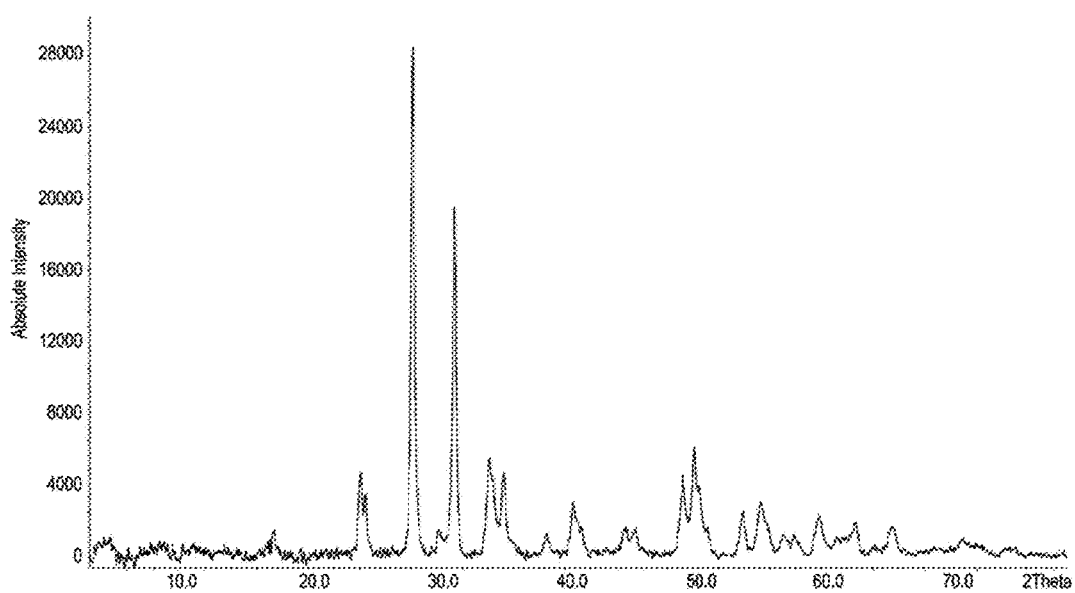
FIG. 1 is a diffraction pattern measured on the sputtering material of Example 1.

In the present invention, it has been realized that a zirconium oxide based sputtering material is sufficiently conductive for DC sputtering and can be sputtered at low arcing if the zirconium oxide is not only deficient in oxygen but also contains metal oxide dopants (such as yttrium oxide, magnesium oxide and calcium oxide) in low amounts or is even free of such dopants, and shows an additional diffraction peak at 30.2°+/−0.2° 2-theta which is not observed in monoclinic zirconium oxide.

As indicated above, the zirconium oxide sputtering material has an oxygen deficiency, compared to the oxygen content of its fully oxidized form, of at least 0.40 wt %.

Preferably, the oxygen deficiency of the zirconium oxide is at least 0.50 wt %, more preferably at least 0.75 wt %, even more preferably at least 0.90 wt % or at least 1.00 wt %.

In a preferred embodiment, the zirconium oxide has an oxygen deficiency of from 0.40 wt % to 20 wt %, more preferably from 0.50 wt % to 15 wt % or from 0.75 wt % to 10 wt %, even more preferably from 0.90 wt % to 5.00 wt % or from 1.00 wt % to 3.00 wt %.

As indicated above, the zirconium oxide has a total amount of metal elements other than zirconium, if present at all, of less than 3.0 wt %, based on the total amounts of metal elements including zirconium. In other words, zirconium represents more than 97.0 wt % of the metal atoms which are present in the zirconium oxide.

Preferably, the total amount of metal elements other than zirconium in the zirconium oxide, if present at all, is less than 2.0 wt %, more preferably less than 1.0 wt %, even more preferably less than 0.5 wt % or less than 0.1 wt %, based on the total amount of metal elements including zirconium. In other words, it is preferred that zirconium represents more than 98.0 wt %, more preferably more than 99.0 wt %, even more preferably more than 99.5 wt % or more than 99.9 wt % of the metal atoms which are present in the zirconium oxide.

Preferably, the zirconium oxide contains elements other than zirconium or oxygen in an amount of less than 2.0 wt %, more preferably less than 1.0 wt %, even more preferably less than 0.5 wt % or less than 0.1 wt %. The zirconium oxide may contain zirconium and oxygen, the remainder being unavoidable impurities.

The diffraction peaks P1 at 28.2°+/−0.2° 2-theta and P2 at 31.4°+/−0.2° 2-theta are characteristic for monoclinic zirconium oxide. However, the zirconium oxide sputtering material of the present invention shows a further diffraction peak P3 at 30.2°+/−0.2° 2-theta which is not observed in a diffraction pattern of pure monoclinic zirconium oxide. As shown further below in the Examples, a zirconium oxide based sputtering material showing the monoclinic diffraction peaks P1 and P2 but no diffraction peak P3 or a diffraction peak P3 of very low intensity has a resistivity which is too high for DC sputtering applications.

Typically, the peak P1 is the peak of highest intensity, and the peak P2 is the peak of second-highest intensity in the X-ray diffraction pattern of the zirconium oxide.

Preferably, the intensity ratio P3/P2 is at least 0.06, more preferably at least 0.07, e.g. from 0.06 to 0.5, or from 0.07 to 0.3.

As demonstrated further below in the Examples, electrical conductivity of the sputtering material can be further improved if the average crystallite size, determined via the Scherrer equation, of the zirconium oxide sputtering material is below a certain limit. Preferably, the zirconium oxide has an average crystallite size, determined by applying the Scherrer equation to the most intensive diffraction peak P1, of less than 63 nm, more preferably less than 55 nm, even more preferably less than 50 nm or less than 45 nm.

In a preferred embodiment, the average crystallite size of the zirconium oxide is from 1 nm to less than 63 nm, more preferably from 5 nm to less than 55 nm or from 10 nm to less than 50 nm, even more preferably from 20 nm to less than 45 nm.

Typically, the X-ray diffraction pattern of the zirconium oxide sputtering material shows further peaks at 24.22+/−0.2° 2-theta, 34.3+/−0.2° 2-theta, and 50.2+/−0.2° 2-theta. Just like the peaks P1 and P2, these diffraction peaks are also characteristic for monoclinic zirconium oxide.

Preferably, the zirconium oxide does not comprise pores which have a diameter of more than 70 μm. More preferably, no pores having a diameter of more than 50 μm are present in the zirconium oxide sputtering material.

Preferably, the zirconium oxide has a relative density of at least 85%, more preferably at least 88% or at least 90%.

Preferably, the zirconium oxide represents at least 75 wt %, more preferably at least 85 wt %, even more preferably at least 95 wt % or at least 99 wt % of the sputtering material.

In a preferred embodiment, the sputtering material contains zirconium and oxygen, the remainder being unavoidable impurities.

Preferably, the sputtering material has a resistivity of 600 kΩ or less, more preferably 100 kΩ or less, even more preferably 20 kΩ or less. On the other hand, the sputtering material of the present invention can have a resistivity of at least 0.5 kΩ or at least 1.0 kΩ, but still shows a very good DC sputtering performance with low arcing. So, even if the sputtering material of the present invention has a resistivity of e.g. from 0.5 kΩ to 600 kΩ, or from 1.0 kΩ to 100 kΩ, the sputtering target of the present invention can be operated under DC conditions at low arcing.

The sputtering material can have a specific resistivity of 10 Ωcm or less. Alternatively, it is also possible that the sputtering material has a specific resistivity of more than 10 Ωcm, but still shows a very good sputtering performance with low arcing.

The zirconium oxide can be a mixture of two or more crystalline zirconium oxide phases, e.g. a mixture of a monoclinic zirconium oxide phase and a tetragonal zirconium oxide phase, alternatively a mixture of a monoclinic zirconium oxide phase and a cubic zirconium oxide phase, or a mixture of a monoclinic phase, a tetragonal phase and a cubic phase. If the zirconium oxide is a mixture comprising a monoclinic phase and a tetragonal phase (or a cubic phase), the tetragonal phase (or cubic phase) is preferably present in an amount of at least 1.0 wt %, more preferably at least 2.0 wt % or at least 4.0 wt %, e.g. from 1.0 to 20 wt %, or from 2.0 to 15 wt %, or from 4.0 to 10.0 wt %. The relative amount of the tetragonal phase (or cubic phase) in the zirconium oxide can be determined by X-ray diffraction and comparing diffraction peak intensities of the monoclinic and tetragonal phases.

The sputtering target can be a planar sputtering target or a tubular sputtering target. In a preferred embodiment, the sputtering target is a tubular sputtering target.

Typically, the sputtering target comprises a backing tube or a backing plate onto which the sputtering material is bonded. Optionally, at least one bonding layer can be provided between the sputtering material and the backing tube or plate.

Typically, the backing tube is a metallic tube, such as a tube made of a steel alloy (e.g. a stainless steel). Preferably, the backing tube is made of a non-magnetic material, preferably a non-magnetic steel alloy (e.g. a non-magnetic stainless steel).

In general, bonding layers for promoting adhesion of a sputtering material to the backing tube or plate are known to the skilled person. Typically, the bonding layer is a metal layer, such as a nickel-containing metal layer (e.g. containing at least 30 wt % or at least 35 wt % nickel) or a copper-containing metal layer (e.g. containing at least 30 wt % or at least 35 wt % copper).

As an alternative to the presence of a bonding layer, the outer surface of the backing tube can be subjected to a surface-roughening, e.g. by treatment with an abrasive medium (such as abrasive paper). Just like a bonding layer, surface-roughening is also promoting adhesion of the sputtering material to the backing tube.

The present invention also relates to a process for preparing the sputtering target as described above, wherein the zirconium oxide is prepared by thermal spraying.

Thermal spraying methods for providing a coating on a substrate are known to the skilled person and include e.g. plasma spraying, detonation spraying, wire arc spraying, flame spraying, high velocity oxy-fuel coating spraying (HVOF, HVAF), warm spraying, and cold spraying.

In a preferred embodiment, the thermal spraying is a plasma spraying. Preferably, the plasma spraying is carried out in a reducing atmosphere. Typically, the reducing atmosphere comprises or consists of hydrogen and optionally an inert carrier gas (such as at least one noble gas).

Preferably, the volume ratio of hydrogen to the carrier gas (such as a noble gas) in the reducing atmosphere is at least 0.36, more preferably at least 0.38, or at least 0.45. Appropriate volume ratios of hydrogen to the carrier gas are e.g. from 0.36 to 1.5, more preferably from 0.38 to 1.0 or from 0.45 to 1.0.

As a feedstock for the thermal spraying step, preferably the plasma spraying step, a zirconium oxide can be used.

The zirconium oxide to be used as a feedstock can be $ZrO_2$, e.g. a $ZrO_2$ having a monoclinic crystal structure. Such monoclinic $ZrO_2$ is commercially available. Preferably, the $ZrO_2$ used as a feedstock for the spraying step has a purity of at least 99.0%.

Alternatively, a zirconium oxide starting material (e.g. monoclinic $ZrO_2$) is subjected to a thermal pre-treatment (e.g. at a temperature in the range of from 800° C. to 1800° C. or from 1200° C. to 1600° C.) in a reducing atmosphere (e.g. an atmosphere containing hydrogen and optionally an inert carrier gas such as a noble gas and/or nitrogen), and the pre-treated zirconium oxide is then used as a feedstock for the thermal spraying step.

The average grain size of the zirconium oxide feedstock is not critical. It can have an average grain size within the range of e.g. from 5 µm to 200 µm, or from 15 µm to 150 µm.

Typically, the feedstock material is directly sprayed onto the backing tube or backing plate, or, if present, on the bonding layer.

In principle, no mechanical post-treatment such as pressing or rolling is needed in the process of the present invention.

The present invention also relates to a process for preparing a zirconium oxide coating on a substrate, wherein the sputtering target described above is subjected to a sputtering treatment.

Preferably, the sputtering is a DC sputtering (e.g. DC magnetron sputtering). However, other sputtering methods such as MF sputtering can be used as well. Appropriate conditions for sputtering (e.g. DC sputtering) are commonly known to the skilled person.

The present invention also relates to the use of the above described sputtering target for DC sputtering.

The present invention will now be described in further detail by the following examples.

EXAMPLES

Measuring Methods
Oxygen Deficiency

Oxygen deficiency is determined by heat treatment of the zirconium oxide in air at 1100° C. until no further increase in weight of the zirconium oxide (i.e. no further oxygen uptake) due to oxidation is detected. If no further increase in weight is detected, the zirconium oxide is in its fully oxidized form. The oxygen deficiency OD is calculated as follows:

$$OD = [(\text{weight of oxygen uptake})/(\text{weight of oxygen in the fully oxidized form})] \times 100$$

The stoichiometry and therefore the oxygen content of fully oxidized metal oxides are known. The fully oxidized form of a non-doped zirconium oxide is $ZrO_2$. The fully oxidized forms of commonly used dopants are $Y_2O_3$, $CaO$ and $MgO$.

A sample having a weight $m_0$ after preliminary drying at 105° C. for 10 hours is heated in an oven in air atmosphere at 1100° C. for 300 seconds, cooled to room temperature and weighed (sample weight $m_1$), and subsequently heated at 1100° C. for 20 minutes to make sure that oxidation is completed. Then, the sample is cooled in the oven to a temperature of 100° C., taken out from the oven and air-cooled for another 10 minutes, followed by determining the weight $m_2$ of the completely oxidized sample. Just in case $m_2 > m_1$, a further heat treatment in air atmosphere at 1100° C. is carried out until no further increase in weight is observed.

Based on the increase in weight, the oxygen deficiency of the sample, compared to the oxygen content of its fully oxidized form, can be determined. If the zirconium oxide is non-doped, its fully oxidized form is $ZrO_2$.

X-Ray Diffraction Pattern, Intensity Ratio of Diffraction Peaks

For X-ray diffraction measurements, the samples were hand-grind to a powder in an agate mortar and the powder samples were mounted on a sample holder. X-ray diffraction measurements were carried out on a STADI P two-circle diffractometer from Stoe & Cie in transmission. A linear position sensitive detector LPSD (range of 6.60°) was used. It was measured in the 2-theta range of from 3.000° to 79.990° at a step width of 0.010° and a measuring time of 20 seconds per step. Cu Kα1 radiation (1.54056 Å) was used. The generator was operating at a voltage of 40 kV and a current of 30 mA. For adjustment and calibration of the diffractometer, the NIST standard Si (640 d) was used.

Analysis of the XRD diffraction pattern was carried out by the Stoe software package.

The 2-theta position of a diffraction peak was determined via its peak maximum.

The intensity ratio of two diffraction peaks is the ratio of the maximum heights of these two peaks.

Average Crystallite Size

The diffraction pattern was mathematically fitted by using the Stoe pattern fitting software, and full width at half maximum (FWHM) of each peak was determined.

The measured values were corrected against the device standard LaB6 NIST (660 b).

Using the Stoe software, the average crystallite size was determined by applying the Scherrer equation to the most intensive diffraction peak P1 and P2. As commonly known, the Scherrer equation reads as follows:

$$d = (K^* \lambda)/(\beta^* \cos \theta)$$

wherein
d is the average crystallite size,
K is the dimensionless shape factor,
λ is the X-ray wavelength, β is the line broadening at half the maximum intensity (FWHM), after subtracting the instrumental line broadening, in radians,
θ is the Bragg angle.
For K, a value of 1.0 was taken.
Pore Diameter
Pore diameter was determined on a microsection which was prepared as follows: Sample was vacuum-embedded in a polymer matrix and polished with grinding papers of increasing fineness, finally polished with a 4000 SiC paper. Measuring via line intercept method (DIN EN ISO 643), the mean pore diameter was determined according to the following equation:

$$M=(L*p)/(N*m)$$

wherein
L is the length of the measuring line,
p is the number of measuring lines
N is the number of intersected pores,
m is the magnification Relative density (%)=(measured density/theoretical density)×100    Relative Density Based on the Archimedes' principle, density was measured as follows: The dry weight of a sample was measured. Then, the sample was put into water and its weight in water was measured. The wet sample was weighed again, thereby determining the water uptake. For calculating the sample density, a water density of 0.99791 g/cm$^3$ was assumed. The sample density was calculated as follows:

$$p(sample)=0.99791 \text{ g/cm}^3*(\text{dry sample weight}/(\text{wet sample weight}-\text{weight of sample in water}))$$

As 100% theoretical density, a value of 5.68 g/cm$^3$ was taken.
Resistivity (Ohm)
For determining resistivity, silver contact points (5.5 mm) were applied onto the front and rear sides of a sample. Via the applied contact points, electrical resistivity through the thickness of the sample was determined by using a two point ohmmeter.
Amount of Metal Elements
The amount of metal elements and other elements can be determined by ICP-OEC (inductively coupled plasma optical emission spectrometry).
Preparation of Sputtering Targets
Zirconium Oxide Feedstock Materials Used for the Plasma Spraying
As a plasma spraying feedstock, both doped ZrO$_2$ and non-doped monoclinic ZrO$_2$ powders were used. The feedstock materials had a purity of at least 99.2%.
The following feedstock materials were used:
Feedstock 1: Non-doped ZrO$_2$ (monoclinic structure)
Feedstock 2: ZrO$_2$, doped with 8 weight % Y$_2$O$_3$
Feedstock 3: ZrO$_2$, doped with 5 wt % MgO
Feedstock 4: ZrO$_2$, doped with 5 wt % CaO
All feedstock materials were powders having a granulation of −60+15 μm.
Plasma Spraying
For plasma spraying of the feedstock materials, a water-cooled plasma torch device was used. The plasma torch was operated with a mixture of hydrogen and argon. The mixing ratio can be varied. Details about the hydrogen/argon mixing ratio used in the Examples are provided further below. The powder was injected via a carrier gas directly into the plasma flame. Powder delivery rate was 90 g/min.
In all Examples, the feedstock material was plasma-sprayed onto a tubular support (stainless steel) coated with a roughened Ni layer (acting as a bonding layer for the sputtering material). Tube length: 550 mm.

Example 1

Non-doped ZrO$_2$ (i.e. Feedstock 1) was plasma-sprayed onto the backing tube.

| | |
|---|---|
| Delivery rate of the feedstock into the plasma flame: | 90 g/min |
| The volume ratio of hydrogen to argon: | 0.4 |
| Thickness of the coating sprayed onto the tube: | 2 mm |
| Relative density of the coating: | 89% |
| Oxygen deficiency: | 0.52 wt % |
| Average crystallite size (via Scherrer equation, based on the most intensive diffraction peak): | 41.9 nm |
| Resistivity of the coating: | 500 kΩ |

FIG. 1 shows the diffraction pattern measured on the sputtering material which was obtained by the plasma spraying process as described above. The peak P1 of highest intensity is at 28.2° 2-theta, the peak P2 of second highest intensity is at 31.4°+/−0.2° 2-theta. The peaks P1 and P2 are characteristic for the monoclinic zirconium oxide phase. In between these peaks P1 and P2, there is a peak P3 at 30.2°+/−0.2° 2-theta which is not observed in pure monoclinic zirconium oxide. The intensity ratio P3/P2 is 0.09.

Example 2

Non-doped ZrO$_2$ (i.e. Feedstock 1) was plasma-sprayed onto the backing tube.

| | |
|---|---|
| Delivery rate of the feedstock into the plasma flame: | 90 g/min |
| The volume ratio of hydrogen to argon: | 0.48 |
| Thickness of the coating sprayed onto the tube: | 2 mm |
| Relative density of the coating: | 93% |
| Oxygen deficiency: | 1.05 wt % |
| Resistivity of the coating: | 1.5 kΩ |

Figure 2:
FIG. 2 is a microsection prepared from the sputtering material of Example 2.

From the sputtering material prepared in Example 2, a microsection was prepared and the size of pores was determined. The microsection is shown in FIG. 2. No pores having a pore size of more than 50 μm were detected.

Example 3

The non-doped ZrO$_2$ (Feedstock 1) was subjected to a thermal pre-treatment at 1300° C. for 3 hours in a nitrogen/hydrogen atmosphere (volume ratio N$_2$/H$_2$:95/5). Said pre-treated non-doped ZrO$_2$ was then plasma-sprayed onto the backing tube.

| | |
|---|---|
| Delivery rate of the feedstock into the plasma flame: | 90 g/min |
| The volume ratio of hydrogen to argon: | 0.4 |
| Thickness of the coating sprayed onto the tube: | 2 mm |
| Relative density of the coating: | 89% |
| Oxygen deficiency: | 1.10 wt % |
| Resistivity of the coating: | 80 kΩ |

Comparative Example 1

Non-doped ZrO$_2$ (i.e. Feedstock 1) was plasma-sprayed onto the backing tube.

| | |
|---|---|
| Delivery rate of the feedstock into the plasma flame: | 90 g/min |
| The volume ratio of hydrogen to argon: | 0.35 |
| Thickness of the coating sprayed onto the tube: | 2 mm |
| Relative density of the coating: | 88% |
| Oxygen deficiency: | 0.02 wt % |

-continued

| | |
|---|---|
| Average crystallite size (via Scherrer equation, based on the most intensive diffraction peak): | 67.1 nm |
| Resistivity of the coating: | ∞ (too high to be measured) |

Figure 3:
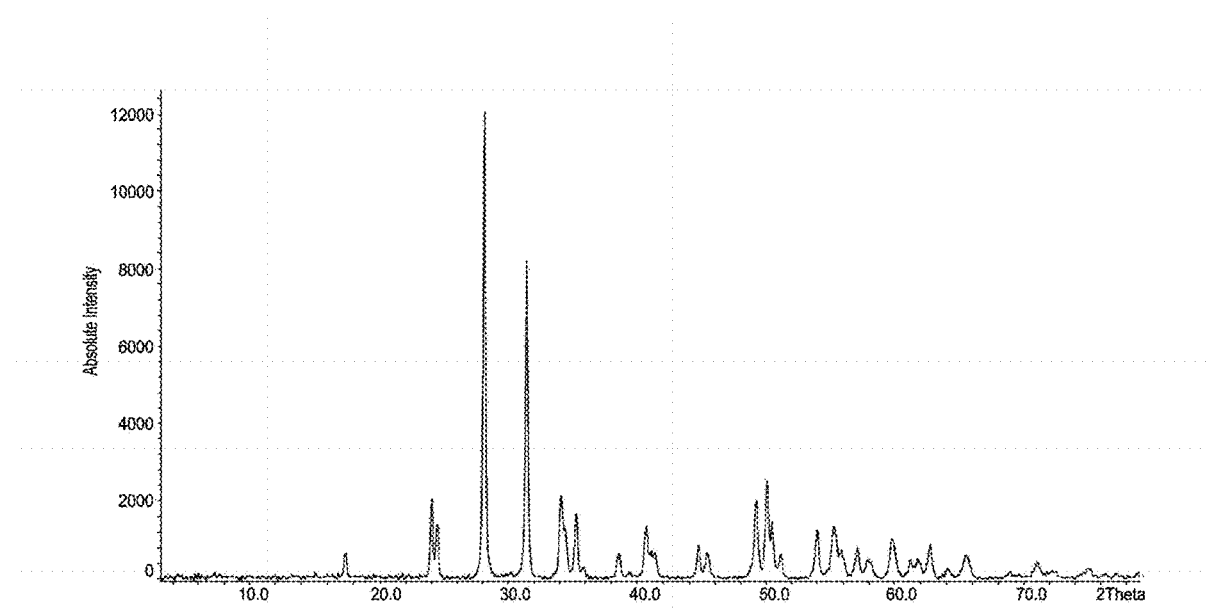
FIG. 3 is a diffraction pattern measured on the sputtering material of Example 3.

FIG. 3 shows the diffraction pattern measured on the sputtering material which was obtained by the plasma spraying process as described above. The peak P1 of highest intensity is at 28.2° 2-theta, the peak P2 of second highest intensity is at 31.4° 2-theta. The peak P3 at 30.2°+/−0.2° 2-theta in between the peaks P1 and P2 is of very low intensity. The intensity ratio P3/P2 is 0.05.

Comparative Example 2

$ZrO_2$ doped with 8 weight % $Y_2O_3$ (i.e. Feedstock 2) was plasma-sprayed onto the backing tube.

| | |
|---|---|
| Delivery rate of the feedstock into the plasma flame: | 90 g/min |
| The volume ratio of hydrogen to argon: | 0.48 |
| Thickness of the coating sprayed onto the tube: | 2 mm |
| Relative density of the coating: | 92% |
| Oxygen deficiency: | 0.0 wt % |
| Resistivity of the coating: | ∞ (too high to be measured) |

Comparative Example 3

$ZrO_2$ doped with 5 weight % MgO (i.e. Feedstock 3) was plasma-sprayed onto the backing tube.

| | |
|---|---|
| Delivery rate of the feedstock into the plasma flame: | 90 g/min |
| The volume ratio of hydrogen to argon: | 0.48 |
| Thickness of the coating sprayed onto the tube: | 2 mm |
| Relative density of the coating: | 93% |
| Oxygen deficiency: | 0.0 wt % |
| Resistivity of the coating: | ∞ (too high to be measured) |

Comparative Example 4

$ZrO_2$ doped with 5 weight % CaO (i.e. Feedstock 4) was plasma-sprayed onto the backing tube.

| | |
|---|---|
| Delivery rate of the feedstock into the plasma flame: | 90 g/min |
| The volume ratio of hydrogen to argon: | 0.48 |
| Thickness of the coating sprayed onto the tube: | 2 mm |
| Relative density of the coating: | 95% |
| Oxygen deficiency: | 0.0 wt % |
| Resistivity of the coating: | ∞ (too high to be measured) |

As shown by Examples 1 to 3 and Comparative Examples 1 to 4, a zirconium oxide sputtering material of low resistivity is obtained if the zirconium oxide is not only deficient in oxygen but also contains metal oxide dopants (such as yttrium oxide, magnesium oxide and calcium oxide) in low amounts or is even free of such dopants, and shows an additional diffraction peak at 30.2°+/−0.2° 2-theta of sufficiently high intensity which is not observed in monoclinic zirconium oxide.

Sputtering Properties

DC (direct current) sputtering conditions:
Non-pulsed direct current (DC) modus under argon (5N purity). No oxygen feed (i.e. no reactive sputtering). The DC sputtering process was operated with the generator AE-Pinacle+20 kW.
Working pressure: $3*10^{-3}$ mbar.
MF (medium frequency) sputtering conditions:
Argon (5N purity). No oxygen feed (i.e. no reactive sputtering). Working pressure: $3*10^{-3}$ mbar.

The tubular sputtering target of Example 2 was successfully ignited. The DC sputtering power was 8 kW/m at a sputtering rate of 31.5 nm*m/min on a low-sodium glass substrate. Linder MF, a pair of tubular sputtering targets was operated at 16 kW/m.

A very low microarcing of less than 5 μarcs/min under DC sputtering conditions and less than 1 μarc/min under MF sputtering conditions was achieved by the sputtering target of the present invention.

Due to their very high resistivity values, the sputtering targets of the Comparative Examples would not ignite under DC sputtering conditions.

The invention claimed is:

1. A sputtering target, which consists essentially of a zirconium oxide as a sputtering material, wherein the zirconium oxide
    has an oxygen deficiency, compared to the oxygen content of its fully oxidized form, of at least 0.40 wt %,
    consists of zirconium, oxygen, and a total amount of metal elements other than zirconium of less than 3.0 wt %, based on the total amounts of metal elements including zirconium, the remainder being unavoidable impurities, and
    has an X-ray powder diffraction pattern having a peak P1 at 28.2°+/−0.2° 2-theta, a peak P2 at 31.4°+/−0.2° 2-theta, and a peak P3 at 30.2°+/−0.2° 2-theta; and
wherein the zirconium oxide is a mixture of two or more crystalline zirconium oxide phases and one of the two or more crystalline zirconium oxide phases is monoclinic; wherein the sputtering material is sprayed onto a backing tube.

2. The sputtering target according to claim 1, wherein the peak P1 is the peak of highest intensity, and the peak P2 is the peak of second-highest intensity in the X-ray diffraction pattern of the zirconium oxide, and the intensity ratio P3/P2 is at least 0.06.

3. The sputtering target according claim 2, wherein the X-ray diffraction pattern of the zirconium oxide shows further peaks at 24.2°+/−0.2° 2-theta, 34.3°+/−0.2° 2-theta, and 50.2°+/−0.2° 2-theta.

4. The sputtering target according to claim 3, wherein the zirconium oxide has an average crystallite size, determined by applying the Scherrer equation to the most intensive diffraction peak, of less than 63 nm.

5. The sputtering target according to claim 2, wherein the zirconium oxide does not comprise pores which have a diameter of more than 70 μm.

6. The sputtering target according to claim 2, wherein the zirconium oxide has a relative density of at least 85%.

7. The sputtering target according to claim 1, wherein the zirconium oxide has an average crystallite size, determined by applying the Scherrer equation to the most intensive diffraction peak, of less than 63 nm.

8. The sputtering target according claim 1, wherein the X-ray diffraction pattern of the zirconium oxide shows further peaks at 24.2°+/−0.2° 2-theta, 34.3°+/−0.2° 2-theta, and 50.2°+/−0.2° 2-theta.

9. The sputtering target according to claim 1, wherein the zirconium oxide does not comprise pores which have a diameter of more than 70 μm.

10. The sputtering target according to claim 1, wherein the zirconium oxide has a relative density of at least 85%.

11. The sputtering target according to claim 1, wherein the zirconium oxide represents at least 75 wt % of the sputtering material.

12. Use of the sputtering target according claim 1 for DC sputtering.

13. The sputtering target of claim 1, wherein the zirconium oxide has a specific resistivity of 10 Ωcm or less.

* * * * *